United States Patent [19]

Yanagida

[11] Patent Number: 5,481,511
[45] Date of Patent: Jan. 2, 1996

[54] ADDRESS TABLE EDITING SYSTEM FOR VOICE DATA RECORDED IN AN OPTICAL DISK

[75] Inventor: Tomokatsu Yanagida, Tokyo, Japan

[73] Assignee: Fujitsu Limited, Kawasaki, Japan

[21] Appl. No.: 431,956

[22] Filed: May 1, 1995

Related U.S. Application Data

[63] Continuation of Ser. No. 338,819, Nov. 10, 1994, abandoned, which is a continuation of Ser. No. 164,850, Dec. 9, 1993, abandoned, which is a continuation of Ser. No. 426,756, Oct. 26, 1989, abandoned.

[30] Foreign Application Priority Data

Oct. 26, 1988 [JP] Japan .................................. 63-270294

[51] Int. Cl.⁶ ............................. G11B 17/22; G11B 27/02
[52] U.S. Cl. ................................................ 369/32; 360/13
[58] Field of Search ....................... 369/32, 30, 34, 369/47, 50, 53, 56, 57, 124, 131; 364/243.3, 900, 919; 360/13, 49, 51, 12

[56] References Cited

U.S. PATENT DOCUMENTS

| | | | |
|---|---|---|---|
| 4,422,105 | 12/1983 | Rodesch et al. | 360/72.1 |
| 4,636,879 | 1/1987 | Narita et al. | 360/72.2 |
| 4,680,594 | 7/1987 | Bracht | 369/54 |
| 4,701,814 | 10/1987 | Westall | 360/72.3 |
| 4,774,600 | 9/1988 | Baumeister | 560/14.1 |
| 4,779,252 | 10/1988 | Custers et al. | 369/30 |
| 4,868,687 | 9/1989 | Penn et al. | 360/13 |
| 4,903,148 | 2/1990 | Amano et al. | 360/13 |
| 5,063,547 | 11/1991 | Custers et al. | 369/32 |

FOREIGN PATENT DOCUMENTS

| | | |
|---|---|---|
| 59-219795 | 12/1984 | Japan. |
| 60-246079 | 5/1985 | Japan. |
| 62-16274 | 1/1987 | Japan. |

OTHER PUBLICATIONS

Patent Abstracts Of Japan, vol. 12, No. 97 (P–682) 30 Mar. 1988 & JP–A–62 229 589 (Kyocera Corp) 8 Oct. 1987.
Patent Abstracts Of Japan, vol. 12, No. 156 (P–701) (3003) 13 May 1988 & JP–A–62 271 278 (Sanyo Electric Co) 25 Nov. 1987.

*Primary Examiner*—Georgia Y. Epps
*Assistant Examiner*—P. W. Huber
*Attorney, Agent, or Firm*—Staas & Halsey

[57] ABSTRACT

An address table editing system for dividing voice data continuously recorded on an optical disk into a plurality of voice files, for setting up a start address and an end address for each of the voice files, and for editing an address table of the voice files. The address table editing system includes a first playback unit which replays the voice data continuously recorded on the optical disk. A detection unit detects a clock time indicating the address of the voice file. An input unit operated by an operator sets up the start address and end address when the operator hears the voice file replayed by the first playback unit. A storage unit stores the address table. The start address and the end address are recorded in the address table of the storage unit when the operator performs the setting up of the address by hearing the voice file replayed from the first playback unit.

8 Claims, 7 Drawing Sheets

CD-ROM

Fig. 4

| VOICE NO. | START ADDRESS MIN SEC BL | END ADDRESS MIN SEC BL |
|---|---|---|
| 0001 | 00 : 00 : 00  SA1 | 00 : 00 : 00  EA1 |
| 0002 | 00 : 00 : 00  SA2 | 00 : 00 : 00  EA2 |
| 0003 | 00 : 00 : 00  SA3 | 00 : 00 : 00  EA3 |
| ⋮ | ⋮ | ⋮ |

ADDRESS TABLE EDITING SYSTEM FOR VOICE DATA RECORDED IN AN OPTICAL DISK

This application is a continuation of application Ser. No. 08/338,819, filed Nov. 10, 1994, now abandoned, which 9,1993, now abandoned, which is a continuation of application Ser. No. 07/426,756 filed Oct. 26, 1989, now abandoned.

BACKGROUND OF THE INVENTION

1. Field of the Invention

The present invention relates to an address table editing system for voice data continuously recorded on an optical disk medium.

The present invention is very effective for setting up the address of voice data on the optical disk medium so that the present invention is also very useful for, for example, an educational system utilizing a personal computer which necessitates high speed access to the voice data.

2. Description of the Related Art

Recently, optical disk mediums, such as a CD (Compact Disk), a CD-ROM (Compact Disk-Read Only Memory) and the like are widely utilized in various fields. There are various advantages in the optical disk medium. A representative advantage of the optical disk medium is a large storage capacity for data and high speed access thereto. Accordingly, the optical disk medium is utilized as a storage means for a data base in a data processing system, and for image data in an image processing system. Further, the optical disk medium is utilized as a storage means for various music in an audio and visual system. In this case, these data bases, image data and music, necessitate high speed access in these systems.

The CD-ROM has the same inner structure and size as that of the CD. This is because the CD was first developed as a music disk in place of the standard analog disk, and as a next stage, the CD has been utilized as a data base in data processing systems. Accordingly, the so-called CD is mainly used as a storage means for various music in the audio field, and the so-called CD-ROM is mainly used as a storage means for various data in the field of data processing system.

Particularly, the CD-ROM is widely utilized for educational systems since it has a large storage capacity and enables high speed access to the data. For example, in CAI (Computer Aided Instruction) which utilizes a computer system to train students, when a student answers a question displayed on the screen, the result is output by a voice from the CAI system. In this case, the voice (for example, "your answer is correct") is previously recorded on the CD-ROM as a voice file.

As mentioned above, particularly in the CAI system, it is necessary to respond to the students answer as fast as possible and to prepare various questions and answers in the system. Accordingly, the CD-ROM is suitable for the above purposes.

SUMMARY OF THE INVENTION

The object of the present invention is to provide an address table editing system for dividing the voice data continuously recorded on an optical disk into a plurality of voice files and for easily editing an address table for each of the voice files.

In accordance with the present invention, there is provided an address table editing system for dividing voice data continuously recorded on an optical disk into a plurality of voice files, for setting up a start address and an end address for each of the voice files, and for editing an address table of the voice files the system comprises a first playback unit for replaying the voice data continuously recorded on the optical disk; a detection unit for detecting a clock time indicating the address of the voice file; an input unit operated by an operator for setting up the start address and end address when the operator hears the voice file replayed by the first playback unit; and a storage unit for storing the address table. The start address and the end address when the operator performs the setting up of the address by hearing the voice file replayed from the first playback unit are recorded in the address table of the storage unit.

BRIEF DESCRIPTION OF THE DRAWINGS

In the drawings:

FIG. 4 is an example of a structural view of a voice control file shown in FIG. 3;

DESCRIPTION OF THE PREFERRED EMBODIMENTS

Before describing the preferred embodiments, an explanation will be given of the problems in the conventional art.

Figure 1:
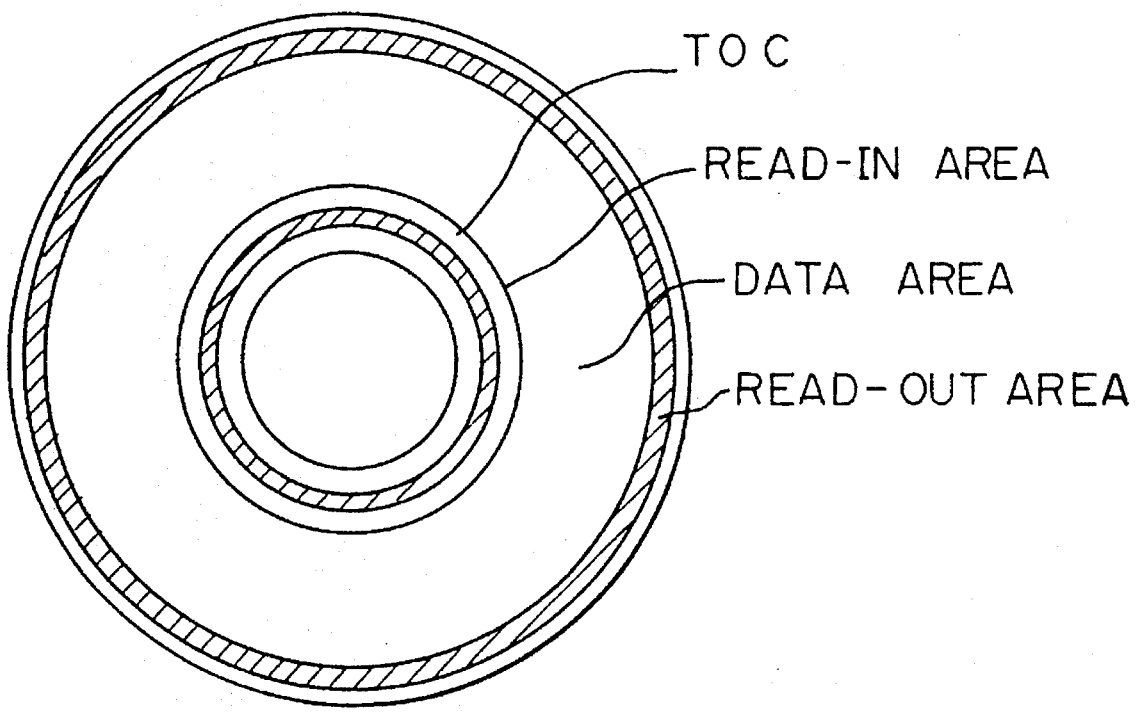
FIG. 1 is a plane view of a CD-ROM.

FIG. 1 is a plane view of a CD-ROM. In FIG. 1, the CD-ROM is mainly formed by a read-in area, a data area and a read-out area. The, the read-in area comprises a TOC (table of contents) area for storing the start and end addresses of each voice file. The CD for the audio has the same structure and size as that of the CD-ROM, but the format of the information block is different as explained below. In this case, although one block is formed by 98 frames, the structure of the frame is omitted for simplifying the explanation.

Figure 2:
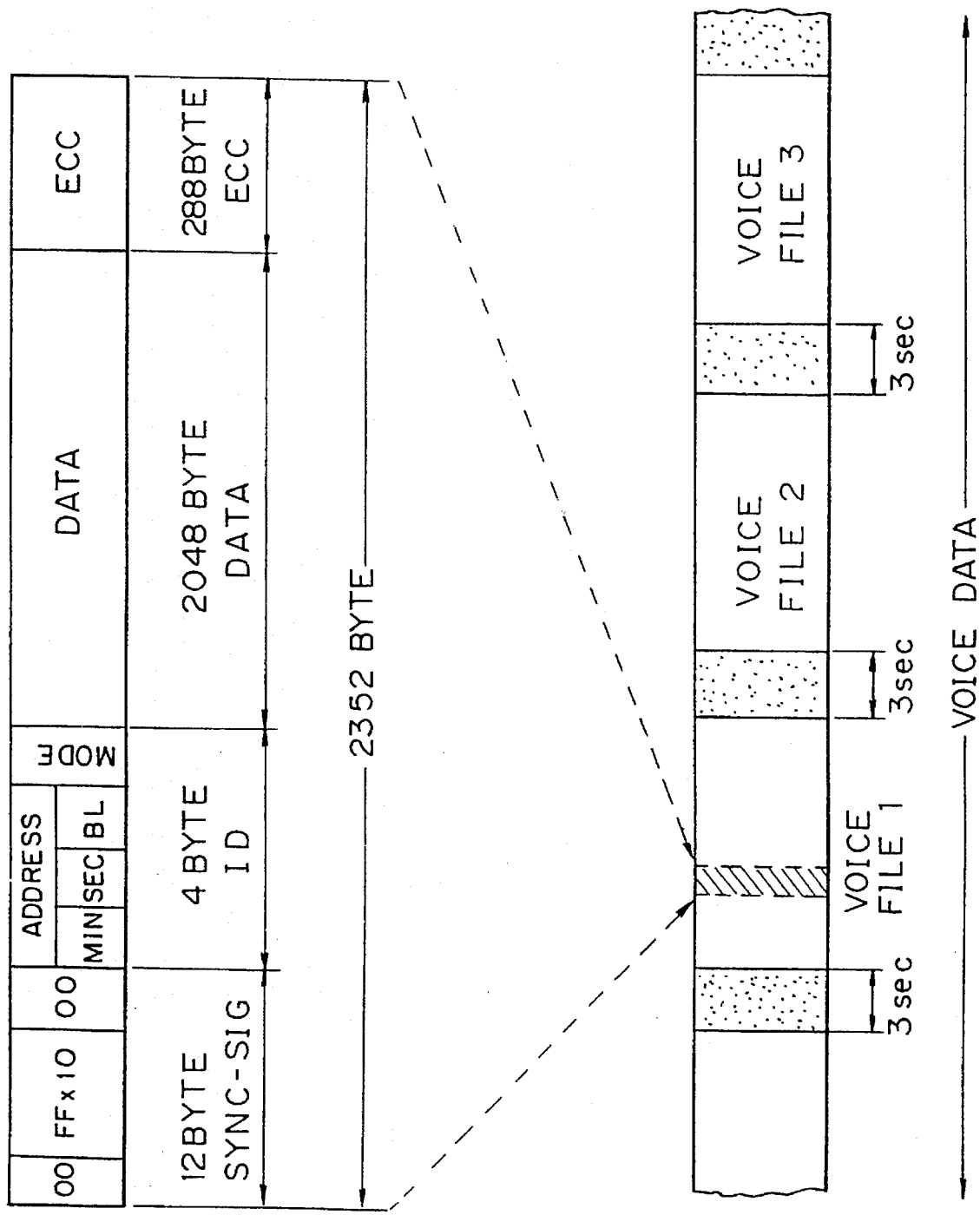
FIG. 2 is a structural view of one block recorded in the CD-ROM.

FIG. 2 is a structural view of one information block recorded in the CD-ROM. As shown in FIG. 2, one block of the CD-ROM is forming by a synchronous signal area (SYNC-SIG) having 12 bytes, an ID area having 4 bytes, a data area (DATA) having 2048 bytes, and an error correcting code area (ECC) having 288 bytes. Accordingly, one block is formed by 2352 bytes in common in the CD and the CD-ROM. However, in the CD, the data area is larger than that of the CD-ROM so that the ECC area becomes narrower than that of the CD-ROM. This is because the importance of error bits is not so great since the CD is mainly utilized for the storage of music.

In FIG. 2, the address of each block is designated by "minute" (MIN) "second" (SEC) and block (BL) in the ID area. That is, the block address is given by real time of the data transfer from "0 to 59" minutes, "0 to 59" seconds, "0 to 74" blocks. In this case, one block shown in FIG. 2 is defined by $1/75$ second. Accordingly, 75 blocks represent one second. Regarding the areas of the SYNC-SIG, the MODE and the ECC, the explanations are omitted since these areas are not directly concerned with the present invention.

In general, the data area is formed by 270,000 blocks. Since the one block is 1/75 second, 270,000 blocks correspond to 3600 seconds (60 minutes, i.e., one hour). Since one data area of one block at the CD-ROM comprises 2048 bytes as explained above, the whole data area of the CD-ROM comprises about 550 MByte (270,000×2048≈553× $10^6$) as the storage capacity. Further, since the storage capacity of one block is 2048 bytes, the CD-ROM can transfer the data at about 150 KByte (2048×75=153,600) per second as the data transfer speed.

As shown in FIG. 2, the voice data is formed by a plurality of voice files and each voice file is constituted by a plurality of blocks. One voice file stores a narration, such as a question or an answer. In this case, a non-voice zone of about 3 seconds is provided between voice files. This three-second zone is defined based on the CD standard. That is, this three-second zone is defined to be a sufficient time for setting up the address of each section of music.

Conventionally, the setting up of the address of the CD-ROM is performed in accordance with the CD method. Further, the address table is necessary for each voice file in the CD-ROM. The address table is used since when a voice file (for example, "your answer is correct") is replayed in, for example, the CAI system, the start address and end address of the corresponding voice file are necessary for reading out from the TOC area. In this case, the computer sends a command to a CD-ROM driver to replay the voice data based on designated addresses.

Conventionally, the address table of the voice file in the CD-ROM is provided by the following steps.

(1) The various analog voice data to be recorded in the CD-ROM are previously recorded on magnetic tape by a tape recorder.

(2) The recorded voice data is edited to predetermined contents on the magnetic tape and a master tape is produced after A/D conversion of the above edited voice data.

(3) The operator replays the master tape, and hears the non-voice zone between the voice files.

(4) The operator detects the address of each voice file at the time of the non-voice zone based on the time (minute, second) displayed on the screen. The address table of each voice file is formed on the master tape based on the above steps.

(5) When an original CD-ROM disk is produced from the master tape, the address table of the voice file is written into the TOC area of the original CD-ROM.

As explained above, many steps are necessary for producing the address table of the CD-ROM and it must be produced in accordance with the standard of the address table of the master tape.

Many voice files, for example, 500 voice files, are necessary for an educational system, for example, the CAI system. In this case, the TOC area of the CD-ROM only can register the start and end addresses of the voice file. As explained above, it is necessary to provide the non-voice zone of about 3 seconds between voice files in the conventional method. Further, it is necessary to provide 500 non-voice zones for the 500 voice files as explained above. Accordingly, 1500 seconds (3×500) are necessary for the non-voice zone. Since the whole data area has 3600 seconds, the non-voice zones occupy a large portion of the data area. Therefore, it is necessary to shorten the non-voice zone to raise the storage capacity of the CD-ROM.

However, when the three second non-voice zone is merely shortened in accordance with the conventional method, some problems occur as explained below. That is, it is difficult to perform the correct setting up of the address by replaying the master tape since the number of voice files is very large. Further, it is difficult to confirm whether or not the set up is correct since the predetermined voice file must search from that address by replaying the master tape. Accordingly, these processes for producing the address table from the master tape in accordance with the conventional method involve a great deal of time and expense.

In the present invention, the address table is directly edited from the voice data on the optical disk medium without replaying the magnetic tape. That is, in the present invention, the voice data on the CD-ROM is directly copied from the digitized voice data recorded in the magnetic tape without applying the address. In this case, the CD-ROM disk is produced through manufacturing processes, i.e., a premastering step, mastering step, pressing step and the like. These processes are not explained in this specification because these steps are not essential to the present invention. The essential feature of the present invention lies in address table editing from the voice data already recorded on the CD-ROM but not yet having an address.

Figure 3:
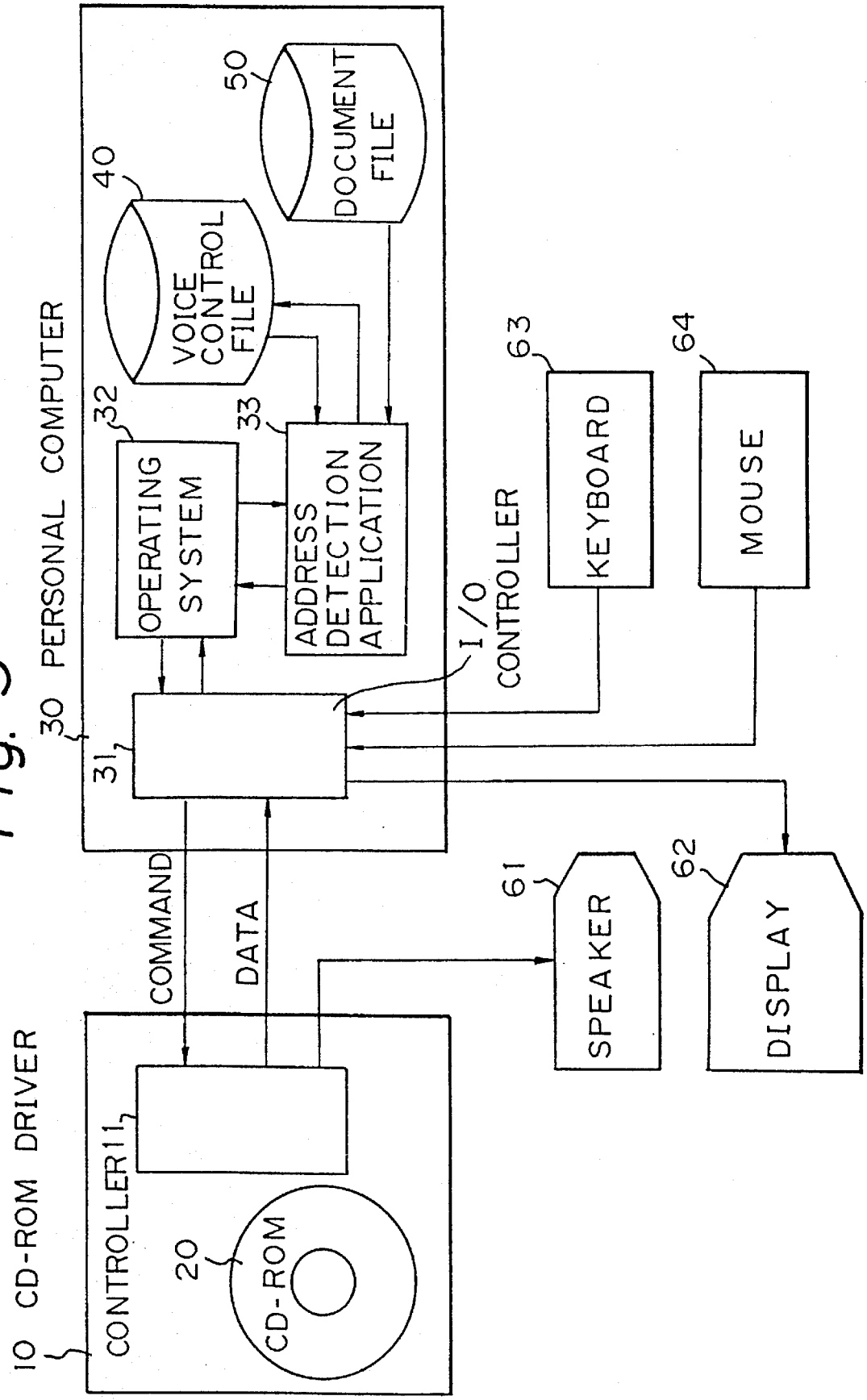
FIG. 3 is a schematic block diagram of an address table editing system according to the present invention.

FIG. 3 is a schematic block diagram of an address table editing system according to the present invention for voice data recorded on an optical disk. In FIG. 3, reference number 10 denotes a CD-ROM driver, 11 a controller, and 20 a CD-ROM. Reference number 30 denotes a personal computer, 31 an I/O controller, 32 an operating system, 33 an address detection application (address map editing application), 40 a voice control file, and 50 a document file. Further, reference number 61 denotes a speaker, 62 a display, 63 a keyboard, and 64 a mouse.

The basic function of the address table editing system can be realized by the address map editing application 33. The voice control file 40 stores the edited address map. The document file 50 stores the character data corresponding to the voice data consisting of a plurality of voice files. In this embodiment, the voice control file 40 and the document file 50 are provided in an external storage means, for example, a fixed disk, in the personal computer 30.

The voice data (for example, "your answer is correct") can be heard from the speaker 61. The display apparatus 62 mainly displays the start address, the end address, and the narration as explained below. The mouse 64 is used for indicating various operations by the operator.

FIG. 4 shows one example of a structural view of a voice control file shown in FIG. 3. This shows a voice file address table. The voice number (VOICE No.) denotes a physical order of the voice file recorded on the CD-ROM. The start address and the end address are not determined at this stage. The start address and the end address are denoted by "0 to 59" minutes (MIN), "0 to 59" seconds (SEC) and "0 to 74" blocks (BL) in accordance with the order of the voice file as explained above. SA1 to SA3 also denote the start address, and EA1 to EA3 also denote the end address instead of the "MIN, SEC, BL". Further, the document file 50 is formed by the voice number and the character data corresponding to that voice number. The contents of the document file 50 are prepared by the operator as explained below.

In the CD-ROM, the non-voice zone between the voice files can be set so as to become very narrow compared with that of the conventional art (about 3 seconds) because the address on the CD-ROM is not set from the master tape. In the present invention, the address table is not stored in the CD-ROM itself. The setting up of the address is performed by the playback of the CD-ROM so that it is possible to set the non-voice zone having a very narrow zone. Accordingly, it is possible to store the voice data at high density in the data area.

The operation of the address table editing system shown in FIG. 3 is explained in detail below.

Figure 5:
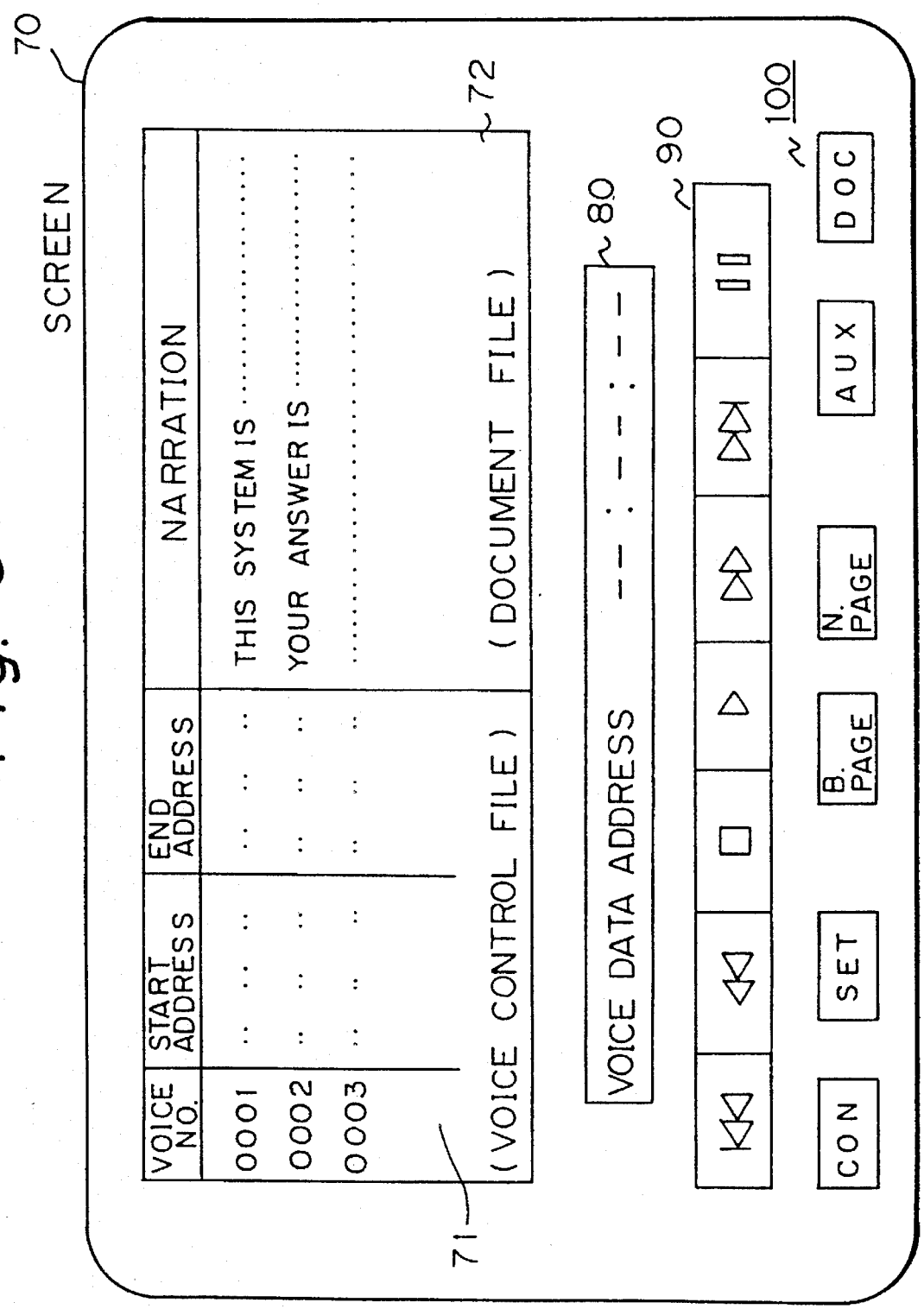
FIG. 5 is a diagram of a screen display for explaining setting up of a start address, an end address, and a narration.

FIG. 5 is a view for explaining setting up of a start address, an end address and a narration by displaying the same on a screen. When this system is turned ON by the operator, the contents of the document file 50 are displayed on the screen of the display apparatus 62 as shown in FIG. 5. The contents of the voice control file 40 and the document file 50 are simultaneously displayed on the screen 70. In this case the space for the start and end addresses in the voice control file displayed 71 is vacant at this stage. Further, the narration (corresponding to a one voice file) is partially displayed on the screen in the document file display area 72.

Reference number 80 denotes the voice file address to be set in each voice number. That is, the address is denoted by "0 to 59" minutes, "0 to 59" seconds, and "0 to 74" block as explained above. 90 denotes icons for designating various modes, for example, FORWARD, FAST FORWARD, STOP and the like. These icons are designated by the mouse 64 operated by the operator. 100 denotes operation marks designated by the operator through the keyboard or the mouse. CON denotes a confirmation of the start address and the end address, SET denotes a setting up of the start and the end address in the input stage, B.PAGE denotes an immediately preceding page of the document, and N.PAGE denotes an immediately following page of the document, AUX denotes an auxiliary control for printing and deletion of the document, and DOC denotes a display of full sentences of one voice file.

Figure 6:
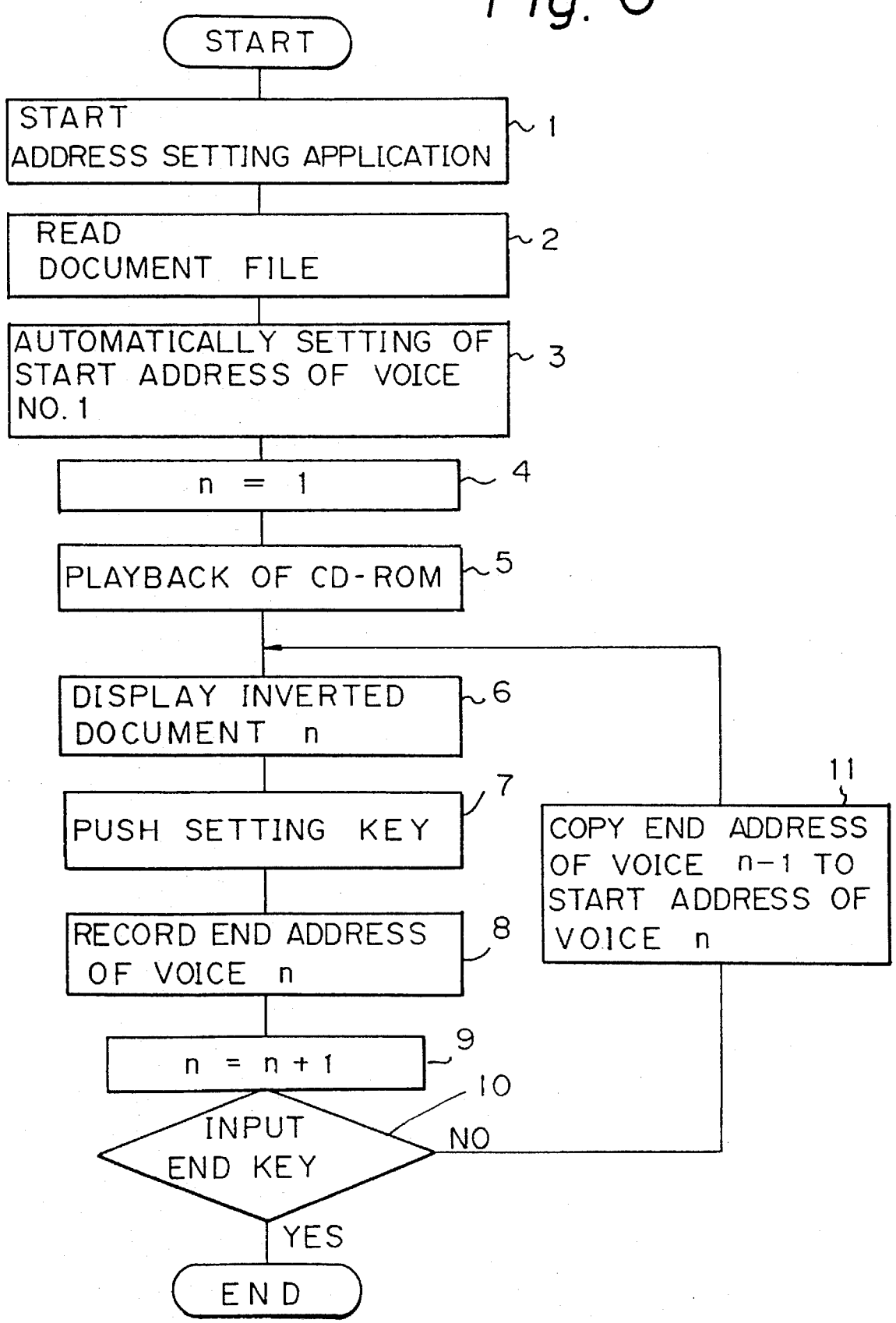
FIG. 6 is a flowchart of editing function of an address map.

FIG. 6 is a flowchart for explaining editing of an address map. In FIG. 6, in the first step, the address setting up application 33 (FIG. 3) having the application program is started (step 1). Next, the document file 50 is read out (step 2), and the contents thereof are displayed on the screen as shown in FIG. 5. The start address of the first voice file and the end address of the final voice file are previously stored in the TOC area of the CD-ROM. That is, all 500 voice files are considered as one voice file, and only the start address and the end address thereof are stored in the TOC area in accordance with the conventional method. When the address setting up mode is designated by the operator, this start address of the CD-ROM is automatically stored in the SA1 of the voice control file 40 as shown in FIG. 4 (step 3). In this stage, preciseness of this start address is not as high as the conventional method.

The start address of the voice number 0001 (n=1) is also displayed (step 4). At that time, the cursor on the screen is positioned on the start address of the voice number 0001. Next, the operator designates the playback mark the icons 90 by using the mouse 64, and the playback is started from the address of the SA1 of the voice control file (step 5). At that time, the character data (i.e., narration) corresponding to the voice number 0001 is displayed in an inverted form on the screen (step 6). In this case, "inverted display" means inversion from white to black, or vice versa, of 10 the characters to clearly indicate the present processing position.

The operator hears the narration output from the speaker 61. This voice corresponds to the narration "THIS SYSTEM IS - - - " in FIG. 5. The operator hears the above narration and notes the sentences displayed on the screen. When the operator hears the non-voice zone after the end of the narration, the operator pushes the key (SET) to set up of the address (step 7). At this time, this address of the CD-ROM is detected as the end address EA1 (step 8). Since this end address EA1 approximately corresponds to the next start address, this end address EA1 is recorded in the SA2 as the start address (step 11). In this case, the cursor on the screen is positioned to the start address SA2 of the voice number 0002. At the same time, the sentence of the voice number 0002 is displayed in inverted form on the screen. These steps are repeated for all voice files so that the addresses of all the voice files can be determined in the voice control file 40. Accordingly, the address table can be determined from the above steps.

Next, an explanation is given of the function of each means shown in FIG. 3. The basic function of the address table editing system lies in the functions of detecting the address which the CD-ROM driver 10 accesses on the CD-ROM 20, and for recording that address in the voice control file 40 when the setting up of the address is input from the SET position by the operator through the mouse 64.

That is, in FIG. 3, an address counter (not shown) is provided in the controller 11 of the CD-ROM driver 10 and the address counter counts the addresses on the CD-ROM 20 when data is being transferred therefrom. Accordingly, when the command (address read command) is sent from the personal computer 30 to the CD-ROM driver 10, the controller 11 receives this command and outputs the value of the address counter to the computer 30. The detected address is recorded in the voice control file 40 and displayed on the screen.

Figure 7:
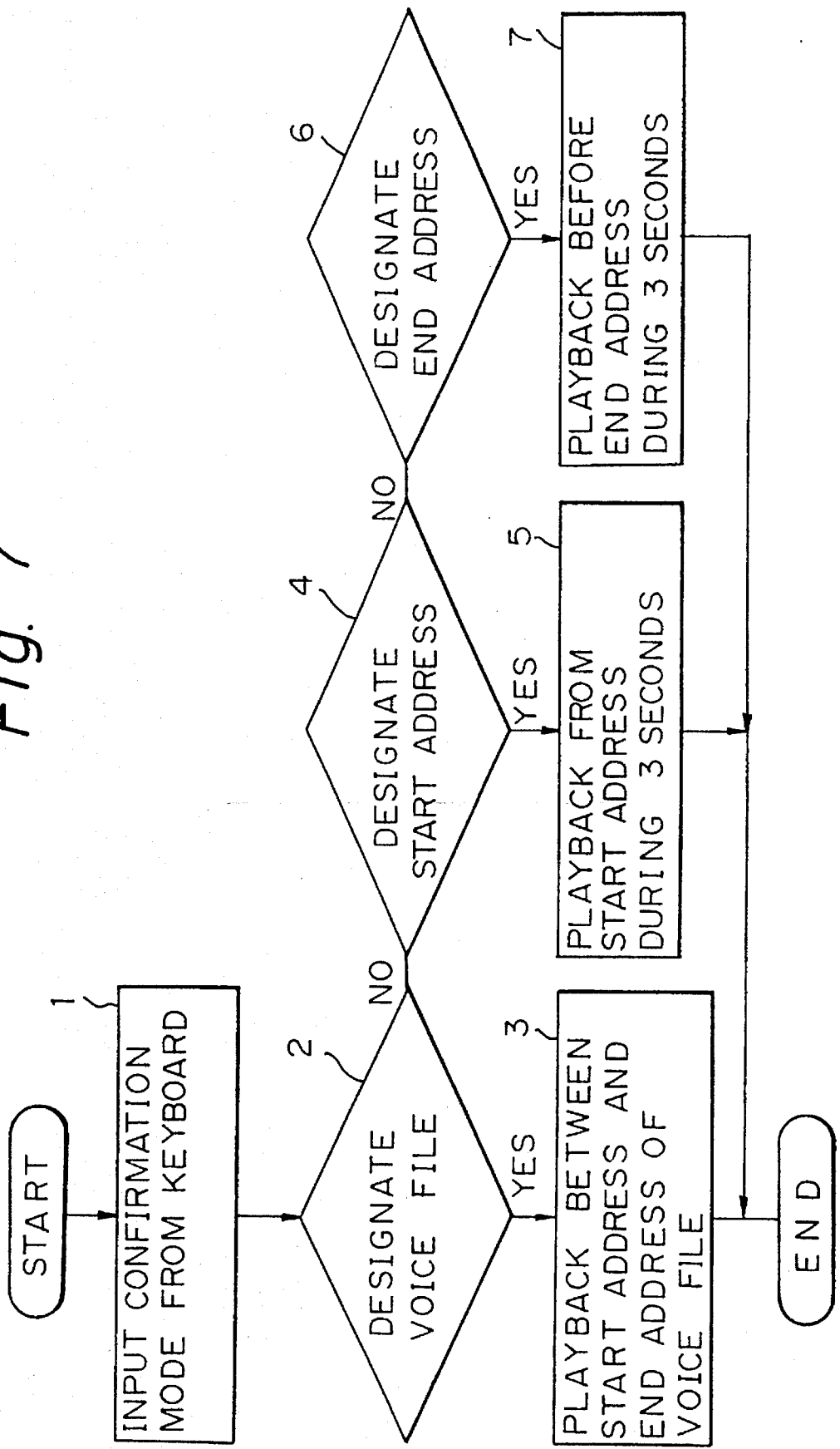
FIG. 7 is a flowchart for explaining confirmation of setting up of the address.

FIG. 7 is a flowchart for explaining confirmation of setting up of the address. These steps explain the confirmation function of the address already set in the address table editing system through the steps of FIG. 6. First, the operator pushes the confirmation key CON shown in FIG. 5 (step 1). When the operator designates the voice number, the start address and the end address are displayed on the screen by using the mouse 64 (steps 2, 4, 6), and the voice file corresponding to the above voice number is read out from the CD-ROM 20 (FIG. 3).

In this case, in the first mode, the playback is performed between the start address and end address as designated by the operator (step 3). In the second mode, the playback is performed from the start address designated by the operator during 3 seconds (step 5). In the third mode, the playback is performed from just before the end address by the operator during 3 seconds (step 7).

Further, it is possible to perform the playback of only the head portion of each voice file during 3 seconds by skipping. Further, it is possible to update the address data of the voice control file 40 by using the keyboard and to confirm the updated address. In this confirmation stage, if the result of the confirmation is not satisfied by the operator, the address can be revised. Further, the confirmation operation is performed again after updating. Accordingly, it is possible to set up the address in the very narrow non-voice zone based on the above steps.

For the function of supporting the setting up of the address, an explanation is given as a function of displaying the character data of the document file 50 corresponding to the voice file. For the method of displaying the document file on the screen, there is the method of displaying only several characters from the head of the sentence, the method of displaying several characters from the head and from the end of one sentence, and the method of displaying full sentences comprising several characters by opening a window in a predetermined space on the screen. These functions are provided in the address detection application 33 and these functions can be optionally selected by the operator.

Further, it is possible to display the character data of the document file corresponding to the voice file in an inverted form. The inverted display is used to stress the particular group of characters. Further, when the operator replays a voice file the start and end addresses of which were already set, the character data corresponding to the voice file being played back is displayed in inverted form on the screen.

When the voice control file 40 is edited by the address table editing system shown in FIG. 3, the address table of the voice control file 40 can be moved with another application program utilizing the voice control file of that CD-ROM. This is because the address table is provided in the voice control file and not provided in the CD-ROM in the present invention. In the conventional method, the address table is provided in the TOC area so that it is impossible to move the address table to another application program.

As explained above, according to the present invention, it is possible to easily edit the address table of a voice file on an optical disk, and to easily confirm and revise the start address and the end address. Therefore, the effect of the present invention is very great, for example, for an educational system, such as CAI, using the optical disk medium and a personal computer.

I claim:

1. An address table editing system for identifying portions of a voice file containing voice data recorded on an optical disk, for setting up a start address and an end address for each of the portions identified in the voice file, and for editing an address table of the portions of the voice file, comprising:

playback means for replaying the voice data of the voice file recorded on the optical disk;

detection means for detecting a clock time indicating at least one of a start address and an end address identifying one of the portions of the voice file during replaying by said playback means;

input means operated by an operator for setting up the start address and the end address when said operator hears the one of the portions of the voice file replayed by said playback means; and storage means for storing the start address and the end address, identifying the one portion of the voice file, in the address table based on the address detected by said detection means when said input means is operated.

2. An address table editing system as claimed in claim 1, wherein said playback means replays the voice data in the voice file based on the start address and the end address stored in the address table during several seconds, in a segment mode, and wherein said input means includes confirmation means for the operator to confirm correctness of the start address and the end address stored in the address table in the segment mode.

3. An address table editing system as claimed in claim 2, wherein said playback means replays the voice data until the end of the voice data unless interrupted by the operator, in a continuous play mode, and wherein said confirmation means is used by the operator to confirm the correctness of the start address and the end address stored in the address table in the continuous play mode.

4. An address table editing system as claimed in claim 2, wherein said playback means replays the voice data from a point several seconds before the start address based on the start address stored in the address table, in a pre-segment mode, and wherein said confirmation means is used by the operator to confirm the correctness of the start address stored in the address table in the pre-segment mode.

5. An address table editing system as claimed in claim 1, wherein said address table editing system further comprises:

first display means for displaying character data of a document file corresponding to the voice data to be identified; and second display means for displaying the character data of the document file in an inverted form when setting up the start address and the end address of the one of the portions of the voice file for supporting the editing of the address table.

6. An address table editing system as claimed in claim 5, wherein said display means displays the character data stored in the document file in the inverted form when replaying the voice data.

7. An address table editing system as claimed in claim 2, wherein said playback means replays the voice data based on the start address for several seconds starting from the start address in a start of segment mode, and wherein said confirmation means is used by the operator to confirm the correctness of the start address stored in the address table in the start of segment mode.

8. An address table editing system as claimed in claim 2, wherein said playback means replays the voice data from a point several seconds before the end address in a end of segment mode, and wherein said confirmation means is used by the operator to confirm the correctness of the end address stored in the address table in the end of segment mode.

* * * * *